United States Patent [19]

Tada

[11] Patent Number: 4,768,171

[45] Date of Patent: Aug. 30, 1988

[54] MEMORY CIRCUIT HAVING A PLURALITY OF CELL ARRAYS

[75] Inventor: Kazuhiro Tada, Tokyo, Japan

[73] Assignee: NEC Corporation, Tokyo, Japan

[21] Appl. No.: 746,699

[22] Filed: Jun. 20, 1985

[30] Foreign Application Priority Data

Jun. 20, 1984 [JP] Japan ................................ 59-126792

[51] Int. Cl.⁴ ........................ G11C 11/40; G11C 13/00
[52] U.S. Cl. .................................... 365/222; 365/189
[58] Field of Search ............... 365/222, 200, 230, 189, 365/182

[56] References Cited

U.S. PATENT DOCUMENTS 3,402,398  9/1968  Koerner et al. ...................... 365/189
3,969,706  7/1976  Proebsting et al. ................. 365/189

Primary Examiner—Terrell W. Fears
Attorney, Agent, or Firm—Sughrue, Mion, Zinn, Macpeak & Seas

[57] ABSTRACT

A semiconductor memory circuit which can operate with reduced value of peak currents.

The memory circuit includes two or more memory cell arrays each having a plurality of memory cells and a peripheral circuit for achieving selective access operation is provided for each array. At least a timing signal and its delayed timing signals are generated in response to a control signal. Both of the timing signal and the delayed timing signal are used to enable the peripheral circuits at different timing.

13 Claims, 5 Drawing Sheets

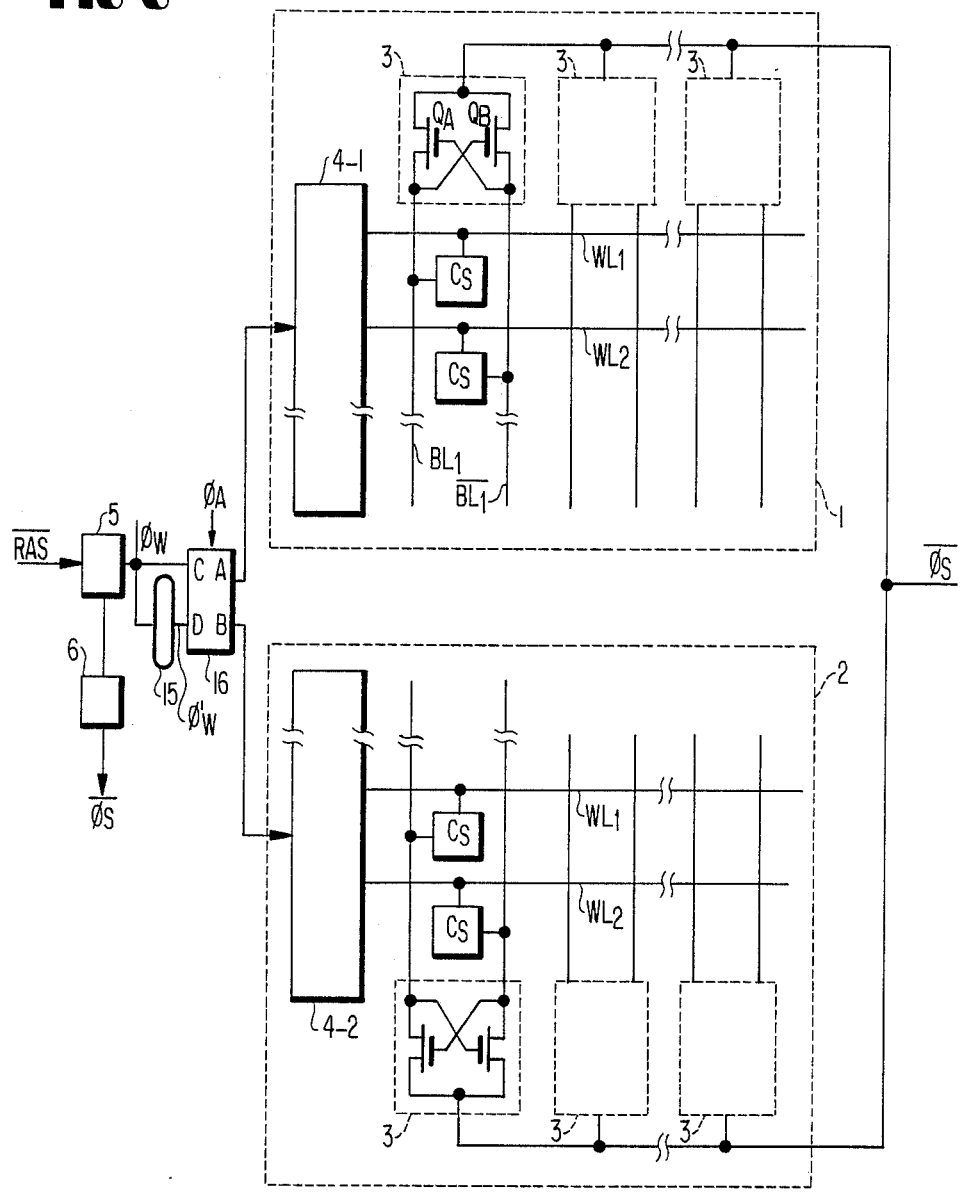

MEMORY CIRCUIT HAVING A PLURALITY OF CELL ARRAYS

BACKGROUND OF THE INVENTION:

The present invention relates to a memory circuit, and more particularly to a dynamic memory circuit having a plurality of memory cell arrays.

The storage capacity of semiconductor memory devices has been becoming greater and greater, and efforts are being made to increase the integration density of integrated circuit chip.

However, if such increase in the storage capacity is achieved by simply increasing the number of memory cells coupled to each word line, the storage capacitance of each word line would become large, resulting in low speed operation.

Furthermore, in the case where the memories are of dynamic type, the written information disappears when a predetermined time has elapsed. Therefore, it is necessary to execute a rewriting cycle called "refresh" within the above time. The refresh is done on the respective word lines one by one and hence, the number of the word lines in the memory corresponds to the cycle times of refresh within the predetermined period of time.

Under the above circumstance, it has been practiced that the memory cells are divided into two or more memory cell arrays each having word lines to which reduced number of memory cells are coupled. In such construction, refresh operations are executed in the respective memory cell arrays in parallel, reducing the time required for refresh for the whole memory cells.

For example, memory cells of a 64 K-bit dynamic RAM are arrayed in two memory cell arrays each having 128 word lines and 256 bit lines, and the whole memory cells are refreshed through 128 refresh cycles. In this kind of memories, one word line in each memory cell array is driven and two word lines are simultaneously driven as a whole in the memory in response to the same driving pulse. Accordingly, the drive circuit for generating the driving pulse is required to have a large driving capacity in order to attain high speed operation. Moreover, since two word lines are driven at the same time to be charged to a power voltage, a large value of peak current necessarily flows to the two word lines through the drive circuit. This peak current causes noise and affects the memory operation, resulting in malfunction.

SUMMARY OF THE INVENTION

It is an object of the present invention to provide a memory circuit which can operate stably without malfunction.

It is another object of the present invention to provide a memory circuit which can operate with a reduced peak value of drive current.

The memory circuit according to the present invention is of the type that a plurality of memory cells are divided into a plurality of arrays each provided with a peripheral circuit, and is featured that the peripheral circuits associated to different arrays are driven at different timings.

According to this feature, simultaneous drive of a plurality of peripheral circuits can be avoided so that a peak value of the driving current caused through the memory operation can be remarkably reduced.

In the peripheral circuit, a word line drive circuit consumes the major part of the peak current, and hence it is very effective to drive at least the word line drive circuits associated to different arrays at different timings.

BRIEF DESCRIPTION OF THE DRAWINGS

FIG. 6 is a schematic block diagram of a major part of a memory according to a second embodiment of the invention;

DETAILED DESCRIPTION OF THE INVENTION

Figure 1:
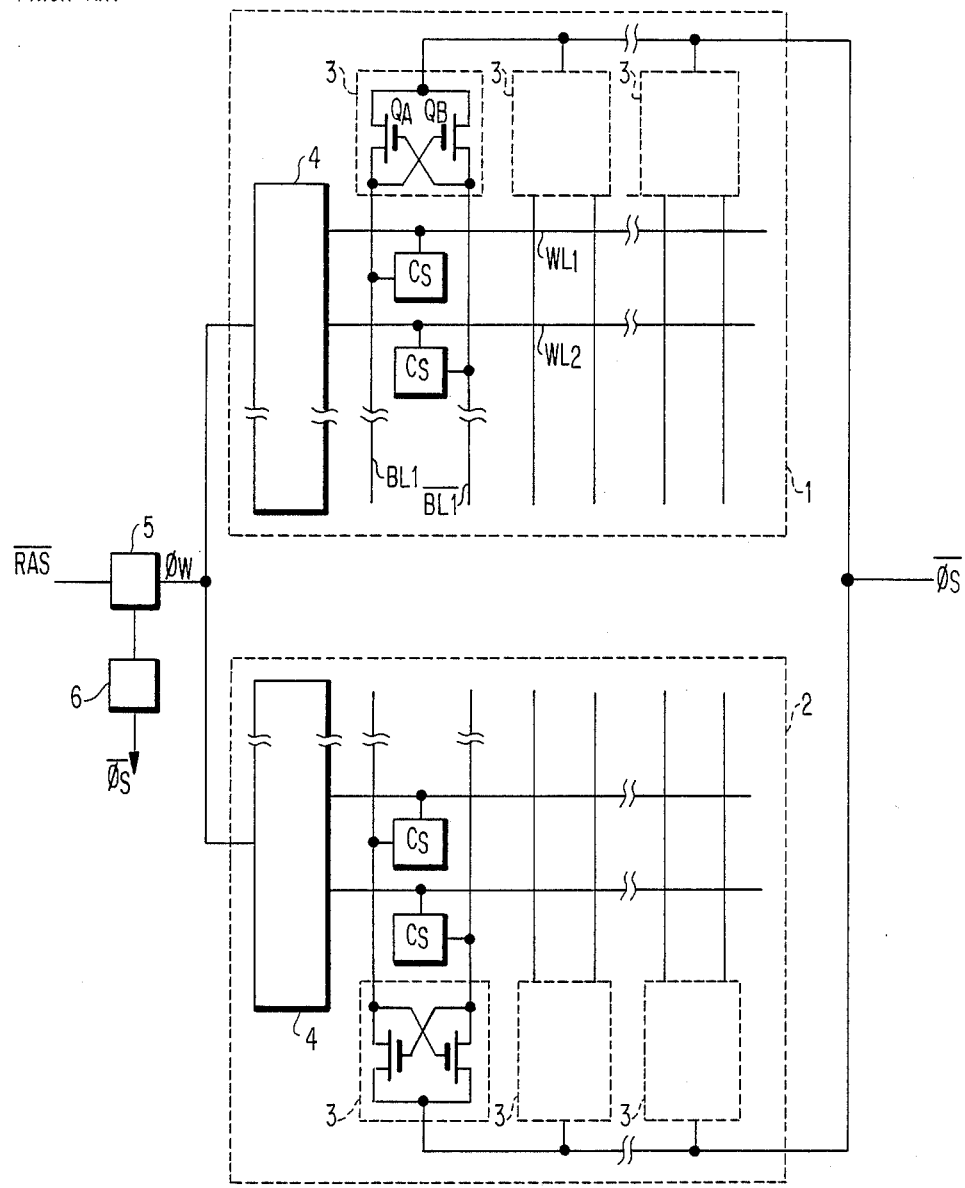
FIG. 1 is a schematic block diagram of a conventional memory circuit.

FIG. 1 is a schematic block diagram of a dynamic RAM which is known as a random access memory (referred to as "RAM", hereinunder) having a large capacity of 64 Kilo bits.

This RAM has two memory cell arrays 1 and 2 each composed of 128 word lines $WL_1$, $WL_2$... arranged in the row direction, 256 bit line pairs ($BL_1$, $\overline{BL_1}$) ... arranged in the column direction, memory cells $C_s$ coupled between the word lines and bit lines, and 256 sense amplifier circuits 3. Each of the memory cell array 1 and 2 is provided with a word selecting circuit 4.

In this known RAM, refreshing of all memory cells $C_s$ is completed in 128 refreshing cycles. To this end, one word line is selected in each array per one access cycle such as to operate 512 sensing amplifier circuits. The word selecting circuits 4 provided for both arrays 1 and 2 are operated simultaneously in response to an activating signal $\phi_W$ which is generated by a timing generator 5 in response to an external clock $\overline{RAS}$.

In such a case, the circuit 5 has to have a large capacity in order to attain high speed operation. A sense enable signal $\overline{\phi_S}$ is the signal to enable the sense amplifiers 3 each composed of cross-coupled transistors $Q_A$ and $Q_B$ when the $\phi_S$ is at low in level. The signal $\phi_S$ is generated by a generator 6.

Figure 2:
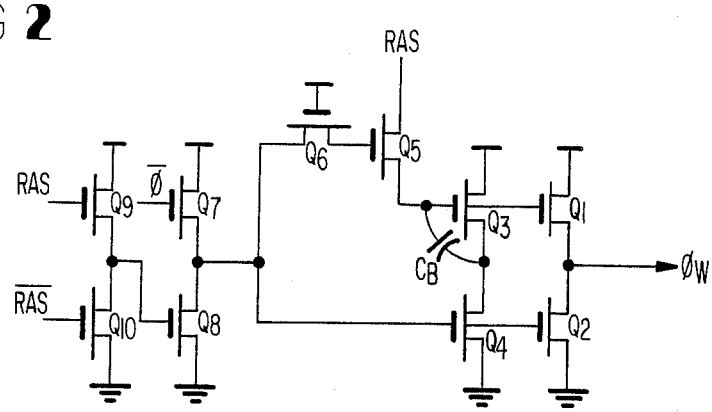
FIG. 2 is a circuit diagram of an example of a conventional block generating circuit.
Figure 3:
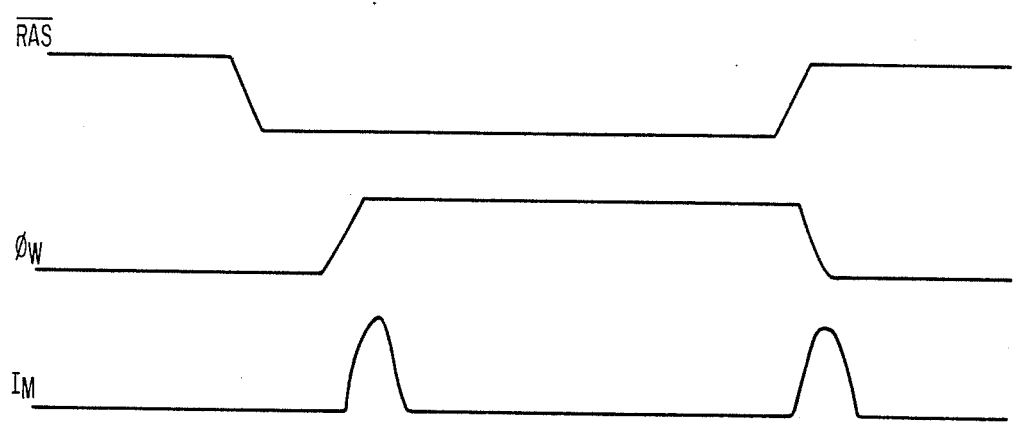
FIG. 3 is a waveform diagram showing operation of the memory in Fig. 1.

FIG. 2 shows a circuit diagram of an example of the clock generating circuit 5 for use in a memory which operates with a 5 V single power supply. This circuit 5 is well known and is composed of N-channel MIS transistors (referred to as "transistors", hereinunder) $Q_1$ to $Q_{10}$ and a boot capacitor $C_B$. In this circuit, the transistors $Q_1$ and $Q_2$ have large driving capacity in order to attain a high speed generation of the signal $\phi_W$. This in turn increases not only the current for charging the signal $\phi_W$ but also the current flowing through the transistors $Q_1$ and $Q_2$ within a period of 5 nS to 10 nS. The waveforms of $\overline{RAS}$, $\phi_W$ and a current $I_M$ of $\phi_W$ are shown in FIG. 3. In case of a memory having a large capacity such as 64 kilo bit or 256 kilo bits, the load capacitance of the signal $\phi_W$ is on the order of several tens of pF and the sum of the charging current and the current through the transistors $Q_1$ and $Q_2$ becomes as large as 50 mA or greater. Thus, the changing rate of the peak current and the current during the operation of the activating signal $\phi_W$ takes a considerably large level of 10 mA/nS or greater.

When the apparatus is composed of a plurality of memories, a specific consideration has to be given in the design of the power source line and the ground line, in order to avoid any unfavourable effect from noise produced by the peak current. The design of the memory itself requires due consideration of way of avoiding the influence of the noise, particularly in the impedance design of wirings.

For instance, when a wiring in which the current is changed at a rate of 10 mA/nS has an impedance of 20 nH, a noise on the order of about 200 mV is inevitably generated. When the information transmitted from the memory cell to the bit line after the selection of the word is sensed and amplified by the bit line sensing amplifier circuit, the potential transmitted to the bit line is on the order of several hundreds of mV so that there is a risk of malfunctioning of the memory even by some fractions of the noise mentioned above. In addition, in order to avoid the influence of this noise, it is necessary to preserve a sufficiently long period of time between the selection of the word line and the sensing and amplification of the bit line.

Thus, the conventional dynamic memory suffers from a problem in that a large charging current and a large throughcurrent flow during the operation of the word line to cause a generation of noise due to a large peak current having a large changing rate, resulting in malfunctioning of the memory.

Figure 4:
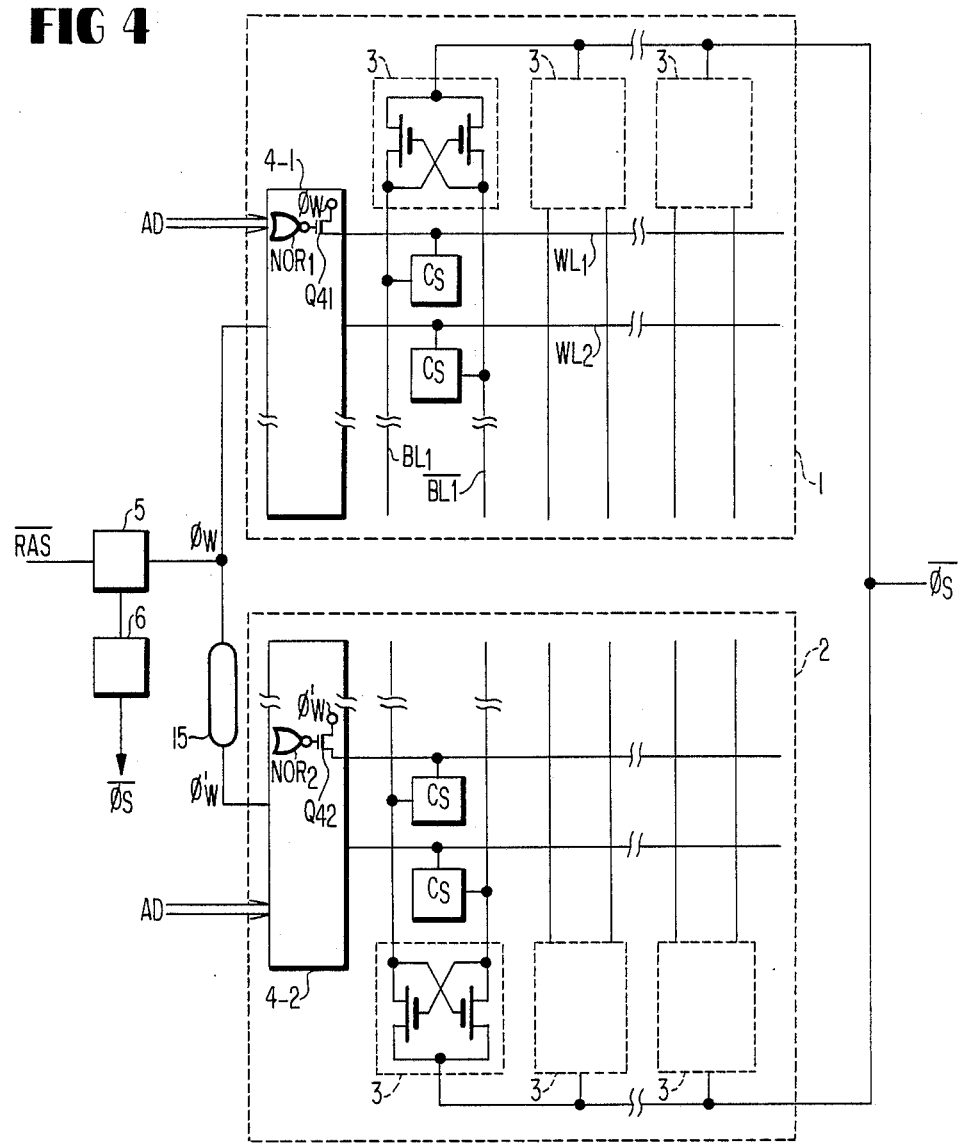
FIG. 4 is a schematic block diagram of a major part of a memory according to a first embodiment of the invention.
Figure 5:
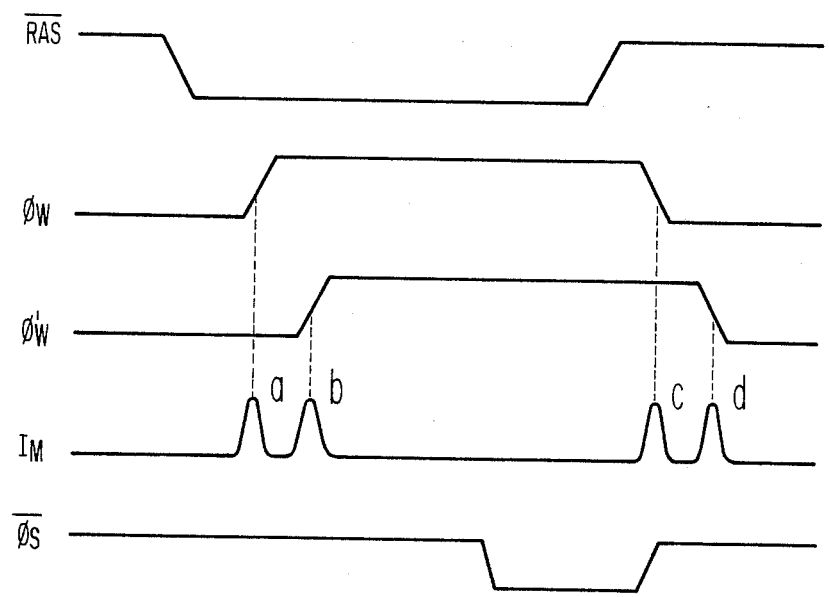
FIG. 5 is a time chart explanatory of the operation of the embodiment shown in FIG. 4.

Referring to FIGS. 4 and 5, the memory circuit according to one embodiment is described.

As shown in FIG. 4, the memory circuit is basically composed of two memory cell arrays 1 and 2. Each of the arrays 1 and 2 includes memory cells $C_S$ coupled between word lines $WL_1$, $WL_2$ . . . and bit line pairs ($BL_1$, $\overline{BL_1}$) . . . and sense amplifiers 3 provided for the respective bit line pairs. The word line driver circuit 4-1 is provided for the array 1 while the word line driver circuit 4-2 is provided for the array 2. The driver circuit 4-1 includes a plurality of driver units ($NOR_1$ and $Q_{41}$) each coupled to each one of word lines. Each of driver units is composed of a NOR gate $NOR_1$ receiving address signals $A_D$ and a driving transistor $Q_{41}$ having a drain receiving an activation signal $\phi_W$, a gate coupled to the output of the NOR gate $NOR_1$ and a source connected to the word line $WL_1$. Other driver units connected to other word lines in the array 1 included in the driver circuit 4-1 have the same circuit structure as that for the word line $WL_1$. The driver circuit 4-2 for the array 2 also includes a plurality of driver units each composed of a NOR gate $NOR_2$ and a driver transistor $Q_{42}$ operating in a source-follower circuit. A drain of the transistor $Q_{42}$ receives another activation signal $\phi'_W$ which is applied to the word line $WL_1$ when the NOR gate $NOR_2$ applies an ON signal to the gate of the transistor $Q_{42}$. The clock generator 5 generates a word line activation signal $\phi_W$ which is directly applied to the driver circuit 4-1. While the signal $\phi_W$ is inputted to a delay circuit 15 from which a delayed activation signal $\phi'_W$ is generated. The signal $\phi'_W$ is used as an activation signal for the driver circuit 4-2. In other words, the activations of the driver circuits 4-1 and 4-2 are executed separately in response to $\phi_W$ and $\phi'_W$, respectively.

In operation, the driver circuit 4-1 corresponding to the memory cell array 1 is enabled first and, with a certain delay of time of the delay circuit 15, the driver circuit 4-2 corresponding to the array 2 is enabled.

The operation of this embodiment will be described hereinunder with reference to FIG. 5.

When the memory is activated by a change of the external signal $\overline{RAS}$ from "H" level to the "L" level, the activating signal $\phi_W$ for activating the driver circuit 4-1 is energized and, with a certain delay of time of the delay circuit 15, the activating signal $\phi'_W$ for activating the driver circuit 4-2 is energized. Subsequently, the external signal $\overline{RAS}$ is changed from "L" level to "H" level so that the state of the memory is changed into precharge state. As a result, the driver circuit 4-1 is precharged and after a delay time provided by the delay circuit 15, the driver circuit 4-2 is precharged.

In consequence, the current $I_M$ flowing in the memory has two small peaks a and b during the activation and small peaks c and d during the precharge.

In the conventional memory shown in FIG. 1, both activating signals $\phi_W$ and $\phi'_W$ charge and discharge simultaneously so that the peaks a and b, as well as the peaks c and d, are overlapped so that peaks of levels about two times as high as that exhibited by the embodiment are thus formed in the current waveform.

For the same reason, the changing rate of the current in the conventional memory is about two times as large as that in the embodiment.

Thus, the described embodiment of the dynamic memory in accordance with the invention allows a reduction of the level of peak current, as well as the changing rate of the current, during the operation of the word line selecting circuit down to about a half of that in the conventional memory. According to the invention, therefore, it is possible to obtain a dynamic memory which can operate stably without suffering from noise caused by the peak current.

FIG. 6 shows a second embodiment of the invention. In this embodiment, a switch circuit 16 for switching $\phi_W$ and $\phi'_W$ is provided, as illustrated.

The switch circuit 16 receives the signals $\phi_W$ and $\phi'_W$ and applies one of the signals $\phi_W$ and $\phi'_W$ to the driver circuit 4-1 and the other of the $\phi_W$ and $\phi'_W$ to the driver circuit 4-2 in response to an address signal $\phi_A$ which is used to designate which one of the arrays 1 and 2 is to be selected. Namely, when the array 1 is to be selected, the circuit 16 transmits the non-delayed signal $\phi_W$ to the driver circuit 4-1 and the delayed signal $\phi'_W$ to the driver circuit 4-2. On the other hand, in the case where the array 2 is to be selected, the circuit 16 applys $\phi_W$ to the driver circuit 4-2 and $\phi'_W$ to the driver circuit 4-1.

Figure 7:
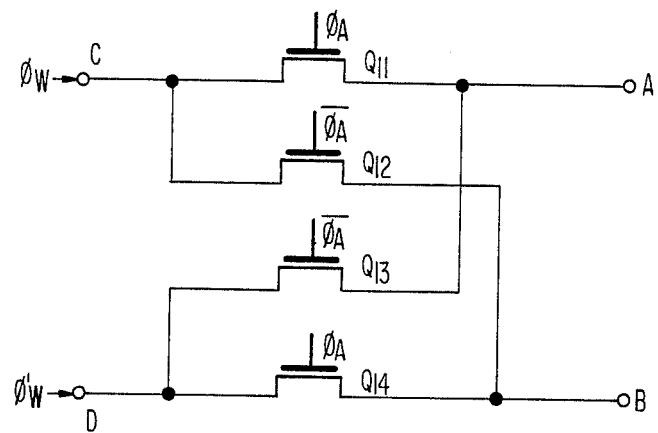
FIG. 7 is a schematic circuit diagram showing the timing signal switching circuit 16 of FIG. 6.
Figure 8:
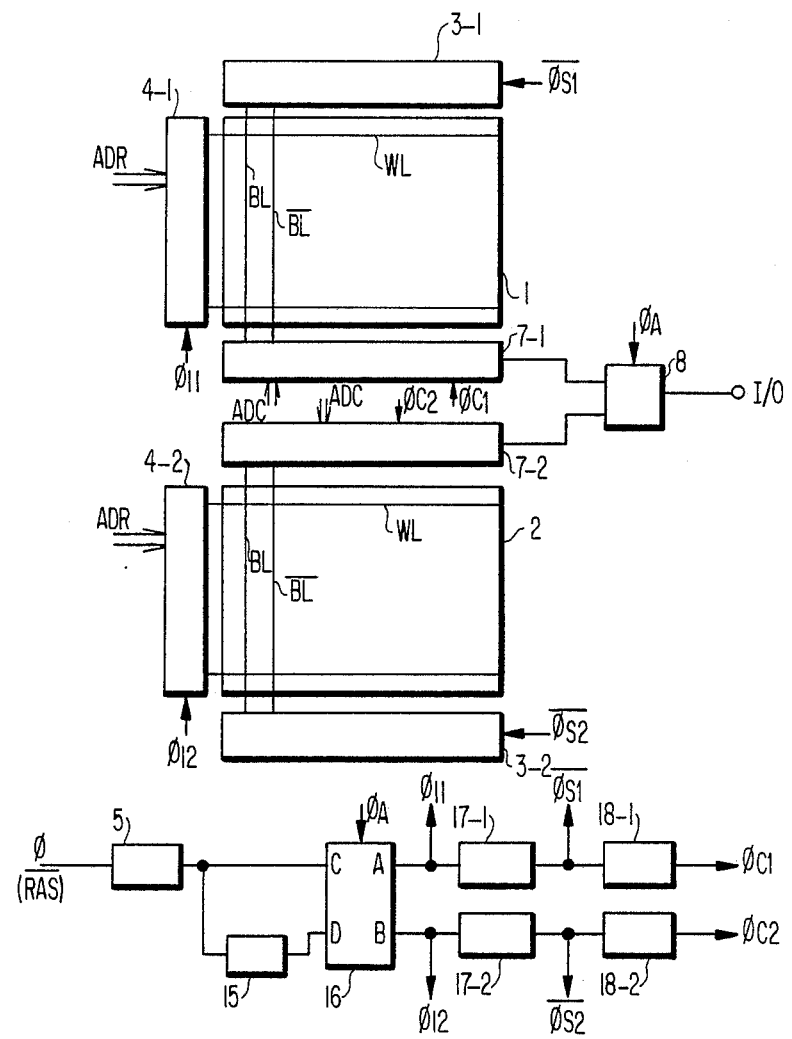
FIG. 8 is a block diagram showing a third embodiment of the invention.

One example of the switch circuit 16 is shown in FIG. 7.

Thus, this second embodiment, therefore, can avoid any increase in the access time which may be experienced in the first embodiment due to the delayed signal $\phi'_W$. More specifically, an address information, particularly the row address information ($\phi_A$) is used to determine which one of two memory cell arrays contains the memory cell to be selected in the preceding access cycle for the outputting or inputting to and from the external device. In this embodiment, making use of this information ($\phi_A$), the driver circuit corresponding to the memory cell array having the memory cell to be accessed is operated first and then the driver circuit belonging to the other memory cell array is operated, so that any undesirable increase in the access time can be avoided advantageously. Needless to say, it is possible to make a design such as to determine the operation sequence appropriately even when the cycle is the refreshing cycles performed in response to an internal address signal.

In the second embodiment, after the completion of the access cycle, the precharge of the driver circuit which was operated first is precharged first, followed by the precharging of the other word line driver circuit. According to this arrangement, all the driver circuits can share an equal activating time, so that any increase in the required activated time due to the time division can be suppressed advantageously.

Namely, since the activating time for activating the memory is controlled by the external signal, the activating time for the driver circuit which was operated second is shortened as compared to that for the driver circuit which was operated first. In the second embodiment, this problem is avoided by the control of the timing of commencement of the precharging.

Referring to FIG. 7, a third embodiment of the present invention is explained. The memory includes two memory cell arrays 1 and 2, a first group of peripheral circuits including a word driver circuit 2-1, sense amplifiers 3-1, and a column selection circuit 7-1 provided for the array 1, a second group of peripheral circuits including a driver circuit 3-2, sense amplifiers 3-2 and a column selection circuit 7-2 provided for the array 2, and an input/output selection circuit 8. The driver circuits 4-1 and 4-2 receive row address signals ADR and are enabled to select one of the word lines in the arrays in response to activation signals $\phi_{11}$ and $\phi_{12}$, respectively. The column selection circuits 7-1 and 7-2 receive column address signals ADC and are enabled to select bit line pairs in each array in response to activation signals $\phi_{C1}$ and $\phi_{C2}$, respectively. The selection circuit 8 selectively couple an input/output terminal I/0 to one of the column selection circuits 7-1 and 7-2 in response to one bit address signal.

The signal generator 5, the delay circuit 15 and the selection circuit 16 are the same as those designated by the same reference numerals in FIGS. 6 and 7.

The outputs A and B of the switching circuits 16 are applied to the driver circuits 4-1 and 4-2 as the signals $\phi_{11}$ and $\phi_{12}$, respectively.

Timing signals generators 17-1 and 17-2 generate timing signals $\phi_{S1}$ and $\phi_{S2}$ for enabling the sense amplifiers 3-1 and 3-2 in response to the signals $\phi_{11}$ and $\phi_{12}$, respectively. Timing signal generators 18-1 and 18-2 generate timing signals $\phi_{C1}$ and $\phi_{C2}$ for enabling the column selection circuits 7-1 and 7-2 in response to the signals $\phi_{S1}$ and $\phi_{S2}$, respectively.

Namely, the timing signal generators 17-1 and 18-1 are provided for the array 1 while the generators 17-2 and 18-2 are provided for the array 2. Through the switch circuit 16, one of the signals $\phi_W$ and $\phi'_W$ is applied to the generators 17-1 and 18-1 connected in cascade while the other of the signals $\phi_W$ and $\phi'_W$ is applied to the generator 17-2 and 18-2 in response to the address signal $\phi_A$.

In this embodiment, not only the activation signals for the driver circuits 4-1 and 4-2, but also the timing signals for other peripheral circuits such as sense amplifiers, column selection circuits are controlled dependent on which one of the arrays is to be selected.

I claim:
1. A memory circuit comprising first and second memory cell arrays each including a plurality of memory cells arranged in rows and columns, a first peripheral circuit for operatively accessing said first memory cell array, a second peripheral circuit for operatively accessing said second memory cell array, means for receiving a control signal, means responsive to said control signal for generating a first timing signal, a delay circuit responsive to said first timing signal for generating a delayed second timing signal, means for applying said first and second timing signals to one and the other of said first and second timing signals to one and the other of said first and second peripheral circuits separately, to thereby enable said first and second peripheral circuits in response to said one and the other of said first and second timing signals, respectively.

2. The memory circuit according to claim 1, wherein said first peripheral circuit includes a first row drive circuit for selectively driving one of the rows of said first array in response to said one of said first and second timing signals and said second peripheral circuit includes a second row drive circuit for selectively driving one of the rows of said second array in response to said other of said first and second timing signals and said second peripheral circuit includes a second row drive circuit for selectively driving one of the rows of said second array in response to said other of said first and second timing signals.

3. The memory circuit according to claim 1, wherein said applying means applies said first timing signal to one of said first and second peripheral circuits which is coupled to the memory cell array to be addressed and said second timing signal to the other of said first and second peripheral circuits which is coupled to the memory cell array not to be addressed.

4. A semiconductor memory circuits comprising a plurality of memory cell arrays, each of said arrays including a plurality of selective refresh circuits provided for said arrays, each of said selective refresh circuits operatively refreshing at least one memory cell in each one of said arrays, means receiving a control signal, a timing signal generator responsive to said control signal for generating at least a first timing signal and a second delayed timing signal, means for applying said first timing signal to a part of said selective refresh circuits to thereby enable said part of said selective refresh circuits, and means for applying said second delayed timing signal to another part of said selective refresh circuits to thereby enable said other part of said selective refresh circuits.

5. The memory circuit according to claim 4, in which each of said selective refresh circuits includes a row selection circuit for selecting the rows of each one of said arrays in response to either of said first and second timing signals applied thereto.

6. The memory circuit according to claim 4, wherein each of said selective refresh circuits includes a row drive circuit for selecting the rows and a plurality of sense amplifiers provided for the columns in each array.

7. The memory circuit according to claim 5, wherein said timing signal generator includes means for generating a third timing signal for enabling the sense amplifiers of a part of said arrays associated to said part of said selective refresh circuits and means for generating a fourth timing signal delayed from said third signal, said fourth signal enabling the sense amplifiers of other part of said arrays associated to said other part of said selective refresh circuit.

8. A semiconductor memory circuit comprising first and second memory cell arrays each having word lines, bit lines and a plurality of memory cells coupled between said word lines and said bit lines; a first word line driver circuit for operatively selecting one of the word lines in said first array; a second word line driver circuit for operatively selecting on of the word lines in said second array; means for receiving a control signal; a timing signal generator for generating a first timing signal and a second timing signal delayed from said first timing signal; means for applying said first timing signal to one of said first and second word line drives circuits to thereby enable said on of said first and second word line driver circuits; and means for applying said second timing signal to the other of said first and second word line driver circuits to thereby enable said other of said first and second word line driver circuits.

9. A semiconductor memory circuit comprising first and second memory arrays, each of said first and second arrays including a plurality of word lines, a plurality bit lines and a plurality of memory cells each coupled to each one of said word lines and each one of said bit line; means for receiving a control signal; a timing signal generator for generating a first timing signal and a second timing signal which is delayed from said first timing signal in response to said control signal; a first word line drive circuit for operatively selecting one of the word lines of said first array in accordance with address signals; a second word line drive circuit for operatively selecting one of the word lines of said second array in accordance with said address signals; means for applying said first timing signal to said first word line drive circuit thereby to enable said first word line drive circuit; and means for applying said second timing signal to said second word line drive circuit thereby to enable said second word line drive circuit; said first and second word line drive circuits including a plurality of selection units each provided for each one of the word lines of said first and second arrays, respectively, each of said selection units of said first word line drive circuit incluidng a logic gate, a source-follower transistor having a gate coupled to an output of said logic, a source coupled to one of the word lines of said first array and a drain supplied with said first timing signal, each of said selection units of said second word line drive circuit including a logic gate, a source-follower transistor having a gate coupled to an output of said logic gate, a source coupled to one of the word lines of said second array and a drain supplied with said second timing signal.

10. The memory circuit according to claim 9, in which each of said logic gates is a NOR circuit.

11. A semiconductor memory circuit comprising a first and second memory arrays, each of said first and second memory arrays including a plurality of word lines, a plurality of bit lines and a plurality of memory cells; a first word line selection circuit coupled to the word lines of said first memory array for operatively selecting one of the word lines of said frist memory; a second word line selection circuit coupled to the word lines of said second memory array for operatively selecting one of the word lines of said second memory array; means for receiving a control signal; a timing signal generator for generating a first timing signal and a second timing signal delayed from said first timing signal in response to said control signal; and a timing signal selection circuit coupled to said timing signal generator and having first terminal coupled to said first word line selection circuit and a second terminal coupled to said second word line selection circuit, said timing signal selection circuit being responsive to address information to output said first and second timing signals from said first and second terminals, respectively when said first memory array is to be accessed and to output said first and second timing signals from said second and first terminals, respectively when said second memory array is to be accessed.

12. The memory circuit according to claim 11, further comprising a plurality of first sense amplifiers coupled to the bit lines of said first memory array; a plurality of second sense amplifiers coupled to the bit lines of said second memory array; means couled to said first terminal for generating a third timing signal for enabling said first sense amplifiers; and means coupled to said second terminal for generating a fourth timing signal for enabling said second sense amplifiers.

13. The memory circuit according to claim 11, in which said timing signal selection circuit includes a first input node to which said first timing signal is applied; a second input node to which said second timing signal is applied; a first field effect transistor coupled between said first input node and said first terminal; a second field effect transistor coupled between said first input node and said second terminal; a third field effect transistor coupled between said second input node and said first terminal; a fourth field effect transistor coupled between said second input node and said second terminal; means for simultaneously rendering said first and fourth transistors conductive when said first memory array is to be accessed; and means for simultaneously rendering said second and third transistors conductive when said second memory array is to be accessed.

* * * * *

UNITED STATES PATENT AND TRADEMARK OFFICE
CERTIFICATE OF CORRECTION

PATENT NO. : 4,768,171
DATED : August 30, 1988
INVENTOR(S) : TADA

It is certified that error appears in the above-identified patent and that said Letters Patent is hereby corrected as shown below:

Column 4, line 21, delete "a and b" insert --$\underline{a}$ and $\underline{b}$--;

Column 4, line 22, delete "c and d" insert --$\underline{c}$ and $\underline{d}$--;

Column 4, line 25, delete "a and b" insert --$\underline{a}$ and $\underline{b}$--;

Column 4, line 26, delete "c and d" insert --$\underline{c}$ and $\underline{d}$--;

Column 7, line 9, delete "on" insert --one--;

Column 7, line 15, delete "on" insert --one--;

Column 8, line 9, delete "frist" insert --first--;

Signed and Sealed this

Fourteenth Day of February, 1989

*Attest:*

DONALD J. QUIGG

*Attesting Officer*         *Commissioner of Patents and Trademarks*